United States Patent
Bergenek et al.

(10) Patent No.: US 8,963,120 B2
(45) Date of Patent: Feb. 24, 2015

(54) OPTOELECTRONIC SEMICONDUCTOR COMPONENT AND PHOTONIC CRYSTAL

(75) Inventors: Krister Bergenek, Regensburg (DE); Christopher Wiesmann, Fürstenfeldbruck (DE); Thomas F. Krauss, Cupar (GB)

(73) Assignees: OSRAM Opto Semiconductors GmbH (DE); The University Court of the University of St. Andrews (GB)

( * ) Notice: Subject to any disclaimer, the term of this patent is extended or adjusted under 35 U.S.C. 154(b) by 213 days.

(21) Appl. No.: 13/514,395

(22) PCT Filed: Nov. 2, 2010

(86) PCT No.: PCT/EP2010/066647
§ 371 (c)(1),
(2), (4) Date: Jul. 3, 2012

(87) PCT Pub. No.: WO2011/069747
PCT Pub. Date: Jun. 16, 2011

(65) Prior Publication Data
US 2012/0261642 A1   Oct. 18, 2012

(30) Foreign Application Priority Data
Dec. 10, 2009   (DE) .......................... 10 2009 057 780

(51) Int. Cl.
*H01L 23/48*   (2006.01)
*H01L 33/22*   (2010.01)
(Continued)

(52) U.S. Cl.
CPC ............... *H01L 33/22* (2013.01); *G02B 1/005* (2013.01); *H01L 33/38* (2013.01); *H01L 2933/0083* (2013.01)

USPC .......... 257/13; 257/21; 257/51; 257/E21.002; 257/E29.347; 257/E29.324; 438/21; 438/51; 438/48; 438/50; 438/413

(58) Field of Classification Search
CPC ............................................... H01L 2933/0083
USPC .......... 257/13, 79, 95, 98, E33.005, E33.067, 257/E33.068, E33.008
See application file for complete search history.

(56) References Cited

U.S. PATENT DOCUMENTS

2004/0206962 A1   10/2004   Erchak et al.
2005/0035354 A1*  2/2005   Lin et al. .......................... 257/79
(Continued)

FOREIGN PATENT DOCUMENTS

DE   10 2008 030 751 A1   12/2009
EP   1 387 413 A2   2/2004
(Continued)

OTHER PUBLICATIONS

Broeng, et al, "Waveguidance by the Photonic Bandgap Effect in Optical Fibres," Journal of Optics, A: Pure and Applied Optics, Institute of Physics Publishing, Bristol, GB, vol. 1, No. 4, Jul. 1, 1999, pp. 477-482.
(Continued)

*Primary Examiner* — Jerome Jackson, Jr.
*Assistant Examiner* — Bo Fan
(74) *Attorney, Agent, or Firm* — DLA Piper LLP (US)

(57) ABSTRACT

An optoelectronic semiconductor component includes a semiconductor layer sequence having at least one active layer, and a photonic crystal that couples radiation having a peak wavelength out of or into the semiconductor layer sequence, wherein the photonic crystal is at a distance from the active layer and formed by superimposition of at least two lattices having mutually different reciprocal lattice constants normalized to the peak wavelength.

13 Claims, 7 Drawing Sheets

(51) Int. Cl.
*G02B 1/00* (2006.01)
*H01L 33/38* (2010.01)

(56) References Cited

U.S. PATENT DOCUMENTS

| | | |
|---|---|---|
| 2005/0285132 A1 | 12/2005 | Orita |
| 2006/0024013 A1* | 2/2006 | Magnusson et al. .......... 385/129 |
| 2006/0204865 A1 | 9/2006 | Erchak et al. |
| 2007/0257269 A1* | 11/2007 | Cho et al. ........................ 257/95 |
| 2010/0127295 A1* | 5/2010 | Kim et al. ........................ 257/98 |

FOREIGN PATENT DOCUMENTS

| | | |
|---|---|---|
| EP | 1 460 460 A2 | 9/2004 |
| EP | 1 855 327 A2 | 11/2007 |
| EP | 2 192 626 A2 | 6/2010 |
| WO | 2009/155899 A1 | 12/1999 |

OTHER PUBLICATIONS

Fehremback, et al, "Highly Directive Light Sources Using Two-Dimensional Photonic Crystal Slabs," Applied Physics Letters, vol. 79, No. 26, Dec. 24, 2001, pp. 4280-4282.

* cited by examiner

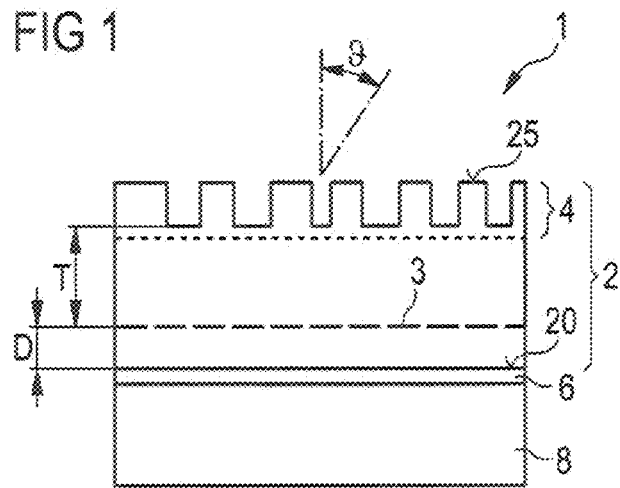
FIG 1
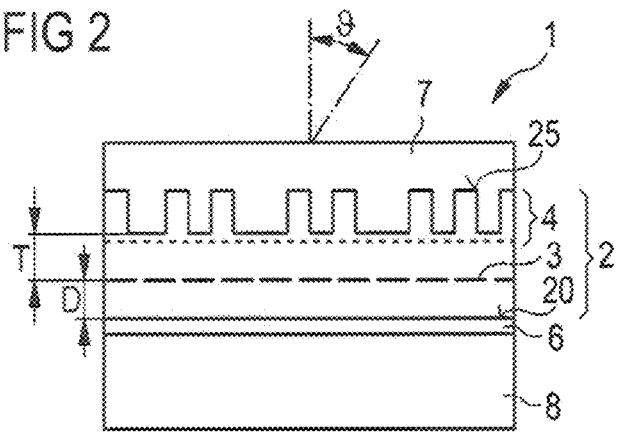
FIG 2
FIG 3
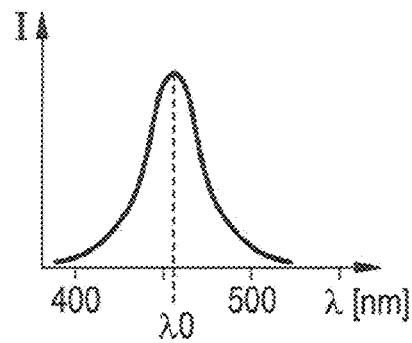
A)
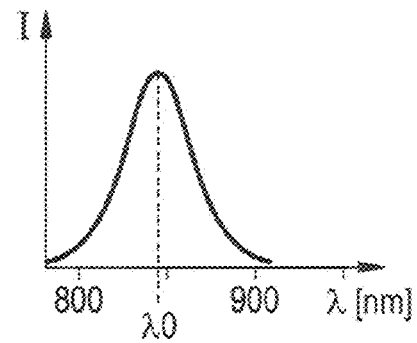
B)

A)

B)

OPTOELECTRONIC SEMICONDUCTOR COMPONENT AND PHOTONIC CRYSTAL

RELATED APPLICATIONS

This is a §371 of International Application No. PCT/EP2010/066647, with an international filing date of Nov. 2, 2010 (WO 2011/069747, published Jun. 16, 2011), which is based on German Patent Application No. 10 2009 057 780.7 filed Dec. 10, 2009, the subject matter of which is incorporated herein by reference.

TECHNICAL FIELD

This disclosure relates to an optoelectronic semiconductor component, particularly to a photonic crystal.

BACKGROUND

Applied Physics Letters, Volume 79, Number 26, pages 4280 to 4282, December 2001, disclose a light source which emits directional radiation and which comprises a two-dimensional photonic crystal.

It could, however, be helpful to provide an optoelectronic semiconductor component which emits radiation into a specific solid angle range with high efficiency and to provide a photonic crystal for coupling in radiation or for coupling out radiation.

SUMMARY

We provide an optoelectronic semiconductor component including a semiconductor layer sequence having at least one active layer, and a photonic crystal that couples radiation having a peak wavelength out of or into the semiconductor layer sequence, wherein the photonic crystal is at a distance from the active layer and formed by superimposition of at least two lattices having mutually different reciprocal lattice constants normalized to the peak wavelength.

We also provide a photonic crystal for ultraviolet, visible and/or near-infrared radiation that is free of an active layer that generates radiation or absorbs radiation, and is formed by superimposition of at least two lattices having mutually different reciprocal lattice constants.

We further provide an optoelectronic semiconductor component including a semiconductor layer sequence having at least one active layer, a photonic crystal coupling radiation having a peak wavelength out of or into the semiconductor layer sequence, and a mirror fitted at a main side of the semiconductor layer sequence that faces away from the photonic crystal at a distance between the mirror and the active layer of at least 100 nm and at most 6 µm wherein the photonic crystal is at a distance from the active layer and is formed by superimposition of at least two lattices having mutually different reciprocal lattice constants normalized to a peak wavelength.

BRIEF DESCRIPTION OF THE DRAWINGS

FIGS. 1 and 2 show schematic sectional illustrations of examples of optoelectronic semiconductor components.

FIG. 3 shows a schematic illustration of examples of spectra of a radiation emitted by semiconductor components.

DETAILED DESCRIPTION

Figure 4:
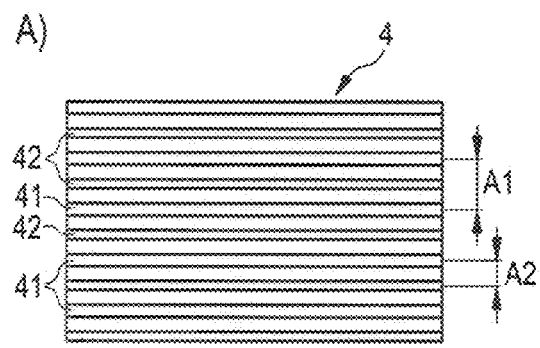
FIGS. 4, 5, 7 and 10 show schematic plan views of examples of photonic crystals.
Figure 4:
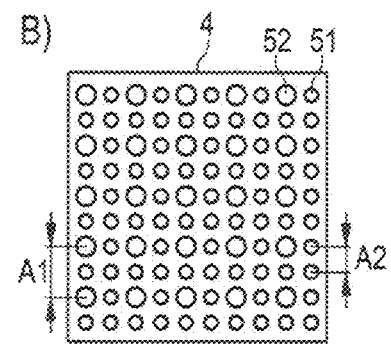
Figure 4:
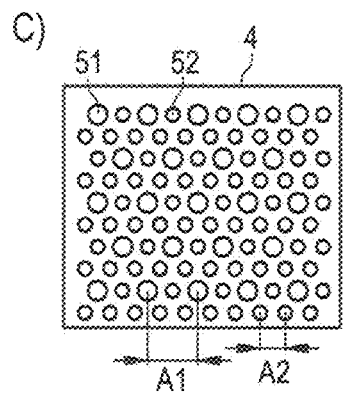
Figure 4:
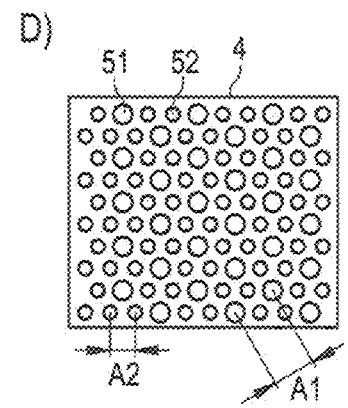

Our optoelectronic semiconductor component may comprise a semiconductor layer sequence having at least one active layer. The at least one active layer is designed to generate or detect electromagnetic radiation during operation of the semiconductor component. The active layer can comprise a single quantum well structure or a multiple quantum well structure of any desired dimensionality.

The radiation generated in the active layer or the radiation to be detected by the active layer may have a peak wavelength. The peak wavelength is that wavelength at which a maximum intensity is present in the spectrum of the radiation to be generated or to be emitted.

The optoelectronic semiconductor component may comprise at least one photonic crystal. The photonic crystal is designed for coupling-in or for coupling-out a radiation generated by the active layer or a radiation to be detected by the active layer.

The photonic crystal may be a material having a periodic variation of the optical refractive index. In this case, a periodicity of the change in refractive index occurs on a scale of the order of magnitude of the vacuum wavelength of the radiation for which the photonic crystal is provided. By way of example, the variation of the refractive index occurs on lengths that are between one quarter and four times the peak wavelength inclusive.

The photonic crystal may be at a distance from the active layer. In other words, the active layer does not directly adjoin the photonic crystal. The active layer is not part of the photonic crystal either.

The photonic crystal may be formed by superimposition of at least two lattices having mutually different reciprocal lattice constants normalized to the peak wavelength. In other words, the photonic crystal comprises at least two lattices having different lattice constants which are combined with one another. A one-dimensional or a two-dimensional Fourier analysis of the photonic crystal therefore yields at least two mutually different lattice constants.

The fact that the reciprocal lattice constants are normalized to the peak wavelength can mean the following: a reciprocal lattice constant $G^*$ arises from an underlying real lattice constant A in a one-dimensional case from the relationship $G^*=2\pi/A$. A wave vector $k_0$ at the peak wavelength $\lambda 0$ results as $k_0=2\pi/\lambda 0$, where $\lambda 0$ is the peak wavelength in a vacuum. The normalized reciprocal lattice constant G then results as $G=G^*/k_0=\lambda 0/A$. For a two-dimensional, hexagonal lattice, for example, this results in $G=(2\ \lambda 0)/(3^{0.5}\ A)$.

The optoelectronic semiconductor component may comprise at least one semiconductor layer sequence having at least one active layer, and at least one photonic crystal for coupling radiation to be generated or to be received by the at least one active layer out of or into the semiconductor layer sequence. The radiation has a peak wavelength. The photonic crystal is at a distance from the active layer and is formed by a superimposition of at least two lattices having mutually different reciprocal lattice constants normalized to the peak wavelength.

Semiconductor layer sequences, in particular for generating an electromagnetic radiation in the ultraviolet, visible and/or near-infrared spectral range, have a comparatively high refractive index of, for example, more than 2 or of more than 3.5. As a result of the high refractive index, in particular, guiding of modes of the radiation in the semiconductor layer sequence having the active layer can occur. This can make it more difficult for these modes to be coupled out of the semiconductor layer sequence.

One possibility for coupling such modes out of a semiconductor layer sequence includes roughening a main area of the semiconductor layer sequence. This generally results in a semiconductor layer sequence which at the main area, is a Lambertian emitter or exhibits an emission characteristic similar to a Lambertian emitter. For applications in which, by way of example, optical systems for focusing are disposed downstream of the semiconductor layer sequence, a more directional emission than in the case of a Lambertian emitter may be desirable.

For efficient coupling-out of light and directional emission, it is possible to shape a photonic crystal at the semiconductor layer sequence. In general, only such a radiation component which fulfills a Bragg condition can be coupled out via a photonic crystal. The Bragg condition establishes, in particular, a relationship between the wavelength of the radiation component and the lattice constant of the photonic crystal. Radiation is coupled out efficiently in general only for those modes of the radiation for which the Bragg condition for the lattice constant of the photonic crystal is fulfilled.

With a photonic crystal formed by a superimposition of lattices having at least two mutually different lattice constants, the Bragg condition can be fulfilled for more modes of the radiation, compared with the case where the photonic crystal is formed only with one lattice having a single lattice constant. With such a photonic crystal, therefore, it is possible to increase, in particular, the coupling-out efficiency of directionally emitted radiation from the semiconductor layer sequence.

The absolute value of a difference between at least two or all of the normalized reciprocal lattice constants is 0.5 to 2.5. To put it another way, the following holds true: $0.5 \leq |G_1 - G_2| \leq 2.5$, where $G_1$ and $G_2$ are the two or two of the normalized reciprocal lattice constants of the lattice. In particular, the absolute value is 0.8 to 1.3. In the case of more than two lattice constants, in particular $G_1$ is the largest and $G_2$ is the smallest of the lattice constants.

One of the normalized reciprocal lattice constants may have a value of 1.0 to 1.35, preferably 1.05 to 1.25, in particular 1.10 to 1.20.

One of the normalized reciprocal lattice constants is 1.7 to 2.6, in particular 1.7 to 1.9 or 2.0 to 2.4.

The photonic crystal may be a part of the semiconductor layer sequence. In this case, the photonic crystal is preferably formed from the same material or based on the same material from which the semiconductor layer sequence is formed. By way of example, the photonic crystal is then structured into a layer of the semiconductor layer sequence, in particular into an outermost layer of the semiconductor layer sequence.

If the photonic crystal is formed by a superimposition of at least three lattices having mutually different lattice constants, then the factors indicated can relate to all or only to a portion of the lattice constants.

The following relationship holds true for one, for two and/or for all of the normalized reciprocal lattice constants G: $0.7 < G < n$, where n is a maximum refractive index of the semiconductor layer sequence, wherein to determine the average refractive index of the semiconductor layer sequence, the photonic crystal itself should not be included, in the case where the photonic crystal is a part of the semiconductor layer sequence.

The at least two lattices which form the photonic crystal may be formed by holes in a layer, in particular in a layer of the semiconductor layer sequence. The holes of the at least two lattices have mutually different average radii of, in particular, greater than zero. In this case, the holes of one of the lattices can be equal to zero such that in places, in other words, holes are omitted in the other lattice. By way of example, the holes have a circular or elliptical outline contour. Equally, the holes can have a square or rectangular outline contour, in particular having rounded corners.

The photonic crystal can accordingly be describable by a single superlattice having a single superlattice constant, wherein lattice points of the superlattice are occupied by holes having different radii. The distribution of the radii of the holes is effected according to the lattice constants of the two lattices whose superimposition forms the photonic crystal, and does not result from the superlattice.

The holes of the two lattices have in each case identical depths within the scope of the production tolerances. In particular, the individual depths of the holes of the two lattices deviate by at most 25% or at most 10% from an average depth, averaged over the holes of both lattices.

The photonic crystal may be formed by superposition of the at least two lattices. Superposition means, in particular, that the photonic crystal is not describable by a single superlattice in which holes having different radii of greater than zero are formed at all lattice points of the superlattice.

Superposition means, in addition or as an alternative to the example described in the preceding paragraph, that the photonic crystal has cutouts having predetermined, different depths. A total depth of the cutouts preferably results from a sum of depths that the individual lattices would have if the latter were not superpositioned.

By way of example, a photonic crystal formed from a superimposition of two lattices having holes having different radii and has a superlattice in which all lattice sites are occupied by holes is not a photonic crystal formed by superposition of two lattices, in this context.

It is likewise possible for superposition to mean that the superimposition of the lattices can be effected independently of one another such that the exact positioning of one lattice can be independent of the exact positioning and/or orientation of the other lattice.

At least two of the lattices, in particular all of the lattices, of the photonic crystal, with a tolerance of at most 25%, may contribute to the same extent to coupling the radiation out of or into the semiconductor layer sequence. The tolerance is preferably at most 10%, in particular at most 5%. The radiation component whose coupling-in or coupling-out goes back to one of the lattices of the photonic crystal can be determined by an analysis of the radiations emitted by the semiconductor component, for example, in a plurality of image planes with different distances from the semiconductor component. The analysis can be influenced, in particular, by what spectral components are emitted into what solid angles.

The at least one active layer may be designed to generate ultraviolet, visible and/or near-infrared radiation, wherein at least 40% of an intensity of the light emitted by the semiconductor component is emitted from the photonic crystal within an angle range, in particular a cone, with an aperture angle of at most 50°, in particular at most 30°. The solid angle range is therefore, for example, at most $0.2\pi$ sr or at most $0.1\pi$ sr. In other words, the coupling of the radiation out of the semiconductor layer sequence is effected in a manner directed by the photonic crystal into a small solid angle range.

The semiconductor component may emit into a solid angle range formed by a cone with an aperture angle of 50° or 30° a radiation component higher by at least 10% or by at least 20% than a so-called "Lambertian" emitter. The emission from the semiconductor component is therefore effected, in particular, more directionally than in the case of a Lambertian emitter.

A side of the photonic crystal that faces away from the active layer may be covered with a radiation-transmissive, dielectrically or, preferably, electrically conductive layer. Such a layer can serve for current spreading or distribution. Cutouts of the photonic crystal which realize a variation of the refractive index can be completely or partly filled with a material of the radiation-transmissive layer. The lattice constants of the photonic crystal are then preferably adapted to the refractive index of the cutouts which is altered by the radiation-transmissive layer. Preferably, the radii of the possibly present holes in the lattices of the photonic crystal are additionally or alternatively likewise adapted.

The photonic crystal may be based on one or on a plurality of the following materials or consists thereof: $Al_nGa_m In_{1-n-m}N$, $Al_nGa_mIn_{1-n-m}P$, $As_nGa_mIn_{1-n-m}P$, ZnO, ZnMgO, CdS, ZnCdS, MgBeO, ZnSe, ZnS, indium tin oxide, or ITO for short. The following is satisfied: $0 \leq n \leq 1$, $0 \leq m \leq 1$ and $n+m \leq 1$, in particular $0 < n < 1$, $0 < m < 1$ and $n+m < 1$. The materials mentioned can additionally contain dopants such as, for example, Si or B.

The photonic crystal may be a one-dimensional crystal. In other words, the refractive index of the photonic crystal is then modulated only along exactly one spatial direction. By way of example, structure elements of the photonic crystal are then formed trench-type cutouts which preferably in each case run along a straight line. Adjacent cutouts preferably do not touch one another.

In other words, a surface of the photonic crystal, as seen in a cross section, can be shaped similarly to a rectangular voltage signal or with rectangular-sawteeth. In this case, in particular, every second rectangular-sawtooth has an identical width and adjacent sawteeth have mutually different widths.

The optoelectronic semiconductor component may be a light-emitting diode.

Furthermore, we provide a photonic crystal. The photonic crystal can be a photonic crystal as described in conjunction with one or more of the examples of the optoelectronic semiconductor component. Features of the optoelectronic semiconductor component are therefore also disclosed for the photonic crystal described here, and vice versa.

The photonic crystal may be designed for ultraviolet, visible and/or near-infrared radiation. The photonic crystal is free of an active layer designed to generate radiation or absorb radiation. Moreover, the photonic crystal is formed by a superimposition of at least two lattices having mutually different reciprocal lattice constants.

An optoelectronic semiconductor component described here and a photonic crystal described here are explained in greater detail below with reference to the drawings on the basis of examples. In this case, identical reference symbols indicate identical elements in the individual figures. However, relationships to scale are not illustrated here. Rather, individual elements may be illustrated with an exaggerated size to afford a better understanding.

FIG. 1 schematically illustrates an example of an optoelectronic semiconductor component 1 in a sectional illustration. A semiconductor layer sequence 2 has an active layer 3, identified as a dashed line. Furthermore, the semiconductor layer sequence 2 comprises a photonic crystal 4 configured by a periodic variation of a refractive index in the form of cutouts in an outermost layer of the semiconductor layer sequence 2. The cutouts do not reach as far as the at least one active layer 3. In the figures, the photonic crystal 4 is divided off from the further parts of the semiconductor layer sequence 2 purely pictorially by a dotted line. The photonic crystal 4 is physically part of the semiconductor layer sequence 2 and formed monolithically with the latter.

A mirror 6 is preferably fitted at a main side 20 of the semiconductor layer sequence 2 that faces away from the photonic crystal 4. The mirror 6 can be a metal mirror, for example, comprising or composed of silver. It is likewise possible for the mirror 6 to be a combination of a transparent material having a low refractive index and a reflective metal layer. The semiconductor layer sequence 2 is fitted to a carrier 8 via the mirror 6. To simplify the graphical illustration, electrical contacts of the semiconductor layer sequence 2 are not illustrated in the figures.

A distance D between the active layer 3 and the mirror 6 is, for example, at least 100 nm and at most 6 µm. Preferably, the distance D is 100 nm to 2 µm, or 100 nm to 150 nm. The distance D is preferably an integral multiple of a peak wavelength $\lambda 0^*$, added to one quarter of the peak wavelength $\lambda 0^*$. By way of example, the distance D is $0.75 \lambda 0^*$ or $1.25 \lambda 0^*$ or $1.75 \lambda 0^*$. In this case, $\lambda 0^*$ is peak wavelength $\lambda 0$ in a vacuum divided by an average refractive index n of that region of the semiconductor layer sequence 2 which lies between the main side 20 and the active layer 3. The distance D is preferably a distance between the mirror 6 and a center of the at least one active layer, in particular in a direction perpendicular to the mirror 6. Particularly in the case of a semiconductor layer sequence based on GaN or InGaN, the following relationship is preferably satisfied for the distance D: $0.5 \lambda 0/n \leq D \leq \lambda 0/n$. A distance T between the photonic crystal 4 and the active layer 3 is, for example, at least 150 nm and at most 8 µm, in particular at least 500 nm and at most 6 µm.

FIG. 2 illustrates a further example of the semiconductor component 1. The photonic crystal 4 is at least partly covered by a transparent, electrically conductive layer 7 at a main side 25 of the semiconductor layer sequence 2 that faces away from the active layer 3. The layer 7 can fill cutouts of the photonic crystal 4 produced in the semiconductor layer sequence 2, partly or, as shown in FIG. 2, completely. By way of example, the electrically conductive layer 7 comprises or consists of a transparent conductive oxide, in particular of indium tin oxide, ITO for short. An average thickness of the electrically conductive layer 7 is, for example, 80 nm to 400 nm, in particular around 120 nm.

A current distribution in a lateral direction can be effected or improved by the electrically conductive layer 7. In particular the distance T between the active layer 3 and the photonic crystal 4 can thereby be reduced as a result of which an overall thinner semiconductor layer sequence 2 can be obtained.

FIGS. 3A and 3B schematically illustrate spectra of a radiation generated by the semiconductor components 1 for instance in accordance with FIGS. 1 and 2. The peak wavelengths $\lambda 0$ are in each case those wavelengths at which a maximum intensity I is present. The peak wavelength $\lambda 0$ is approximately 460 nm in FIG. 3A, and approximately 850 nm in FIG. 3B.

FIG. 4 illustrates various plan views of examples of the photonic crystals 4. The photonic crystals 4 illustrated can be present, in particular, in a semiconductor component 1 in accordance with FIGS. 1 and 2.

The photonic crystal 4 in accordance with FIG. 4A is a one-dimensional photonic crystal, that is to say that a variation of the refractive index is effected only along exactly one lateral direction. The photonic crystal 4 is formed by a superimposition of a first lattice 41 and a second lattice 42. A real lattice constant A2 of the second lattice 42 is half of a real lattice constant A1 of the first lattice 41. Both lattices 41, 42 are formed by strip-shaped or groove-like cutouts, preferably in the semiconductor layer sequence 2. The cutouts run along straight lines. Widths of the cutouts of the lattices 41, 42 differ from one another. As seen in cross section, a surface of the photonic crystal 4 then has a rectangular-sawtooth profile.

In accordance with FIG. 4B, the photonic crystal 4 is formed by superimposition of two lattices having holes 51, 52 having different radii. All the lattice points of a superlattice are occupied by the holes 51, 52 of the two lattices which form the photonic crystal 4, in a manner corresponding to the lattice constant of the two lattices. A distribution of the radii of the holes 51, 52 therefore does not result solely from the superlattice, and so nor does an overall structure of the photonic crystal 4. The superlattice has a square basic structure. The lattice constants of the two superimposed lattices forming the photonic crystal 4 differ by a factor of two.

In accordance with FIG. 4C, the photonic crystal 4 has a hexagonal basic structure. The two lattices forming the photonic crystal 4 are formed by the holes 51, 52 having different radii. The lattice constants of the two lattices differ by a factor of two.

In accordance with FIG. 4D, the photonic crystal likewise has a hexagonal basic structure. The lattice constants of the lattices forming the photonic crystal 4 differ by a factor of a root of 3≈1.73.

In contrast to the illustrations in FIG. 4, the lattices forming the photonic crystal 4 can also have lattice constants which differ from one another by a factor of a root of two or by a multiple of three or multiple of four.

Figure 5:
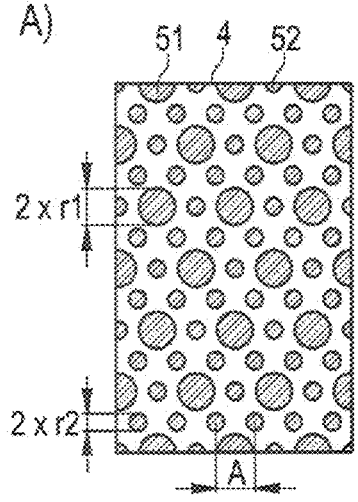
Figure 5:
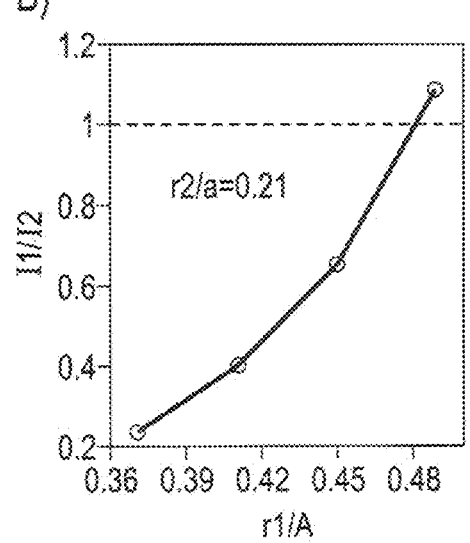
Figure 5:
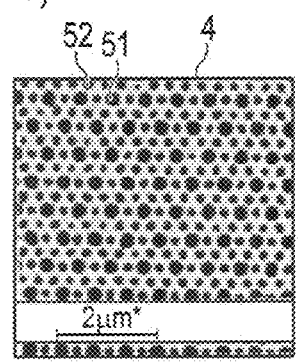

FIG. 5A illustrates the photonic crystal 4 in accordance with FIG. 4C in greater detail. The holes 51 of the first lattice have a larger radius r1. The radius r1 of the holes 51 is, for example, 0.40 times to 0.50 times the real lattice constant A of the lattice having the smaller lattice constant. The radii r2 of the smaller holes 52 are, for example, 0.15 times to 0.30 times the real lattice constant A.

FIG. 5C furthermore shows a micrograph of the photonic crystal 4 recorded by an electron microscope. The semiconductor component 1 comprises a semiconductor layer sequence based on gallium arsenide and having a total thickness (T+D) of approximately 800 nm and emits around a peak wavelength λ0 of approximately 850 nm. The lattice constant A is approximately 270 nm.

FIG. 5B indicates a ratio of radiation intensities I1 and I2 of the radiation intensities coupled out by the lattices forming the photonic crystal 4 as a function of the radius r1 of the holes 51 of the first lattice. In this case, the radius r2 of the smaller holes is 0.21 times the lattice constant A, cf. FIG. 5A. As the value of the radii r1 increases, the proportion of the radiation which is coupled out of the semiconductor layer sequence 2 by the larger holes 51 of the lattice having the larger real lattice constant increases. The ratio I1 to I2 is therefore adjustable by a suitable choice of the radii r1, r2 of the holes 51, 52 of the lattices.

Figure 6:
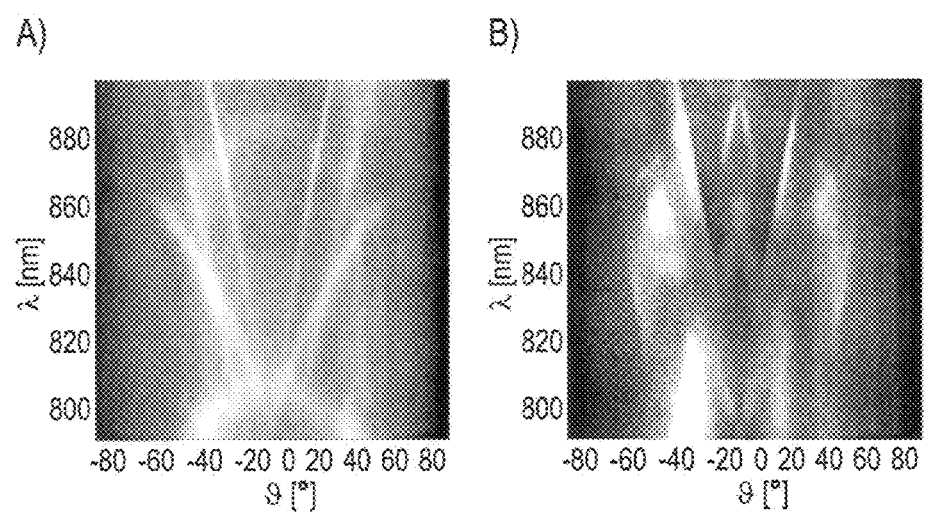
FIGS. 6 and 8 show schematic illustrations of coupling-out efficiencies as a function of an emission angle and a wavelength of examples of semiconductor components.

In FIG. 6, far fields of an emitted radiation are plotted as a function of an emission angle θ and as a function of the wavelength λ. FIG. 6A shows the far field of a component in which the photonic crystal is formed only by a hexagonal lattice, for example, only by the lattice having the smaller holes 52 according to FIG. 5A. For comparison, FIG. 6B illustrates the far field for the semiconductor component 1 comprising the photonic crystal 4 in accordance with FIG. 5C. Bright regions in FIG. 6 are regions into which radiation is emitted by the component or the semiconductor component 1 to an intensified extent.

Figure 7:
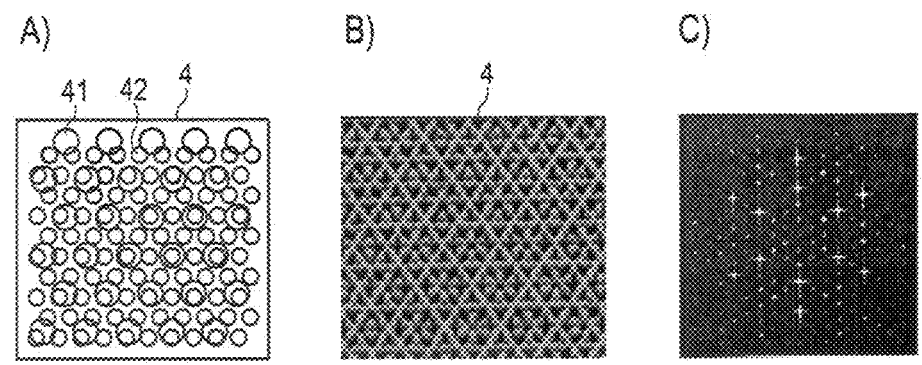

FIG. 7A schematically illustrates a photonic crystal 4 formed by superposition of the lattices 41, 42. By way of example, a total depth of the resulting cutouts in the layer in which the photonic crystal 4 is formed results from a sum of the depths of the cutouts ascribed to the lattice 41 and of the cutouts ascribed to lattice 42. This results in a comparatively complex structure of the photonic crystal 4. This can be seen in the micrograph recorded by an electron microscope in accordance with FIG. 7B.

FIG. 7C furthermore illustrates a two-dimensional Fourier transformation of a top side of the photonic crystal 4 in accordance with FIG. 7B. The Fourier amplitudes for a strongest band of the lattice 41 and for a strongest band of the lattice 42 are equal in magnitude, with a tolerance of at most 25% or of at most 10%. In other words, the respective strongest bands of the lattices 41, 42 in the illustration according to FIG. 7C are approximately equally intensively distinct. It can be read from the Fourier transformation that the intensities of the emitted radiation ascribed to the two superpositioned lattices are comparable in magnitude.

Figure 8:
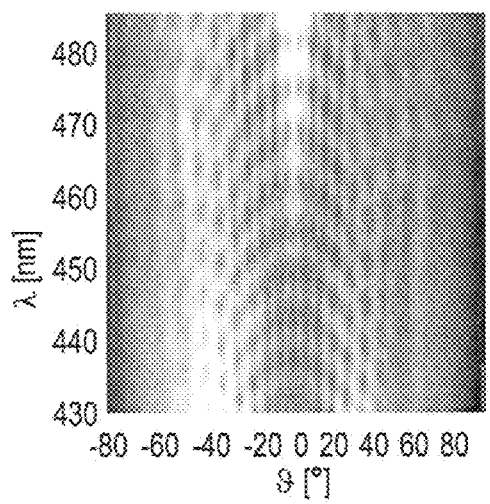
Figure 8:
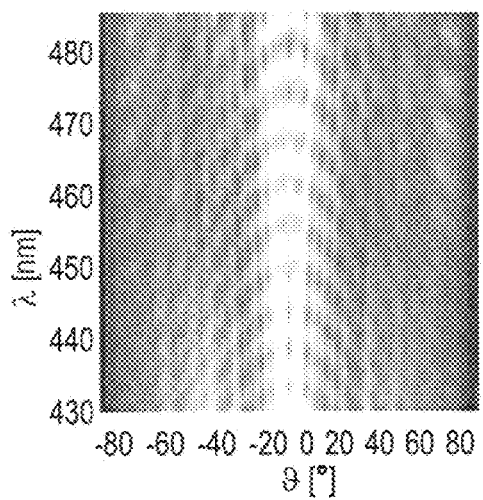

FIG. 8A indicates the optical far field for a component in which a modification of a photonic crystal is formed with only a single lattice, for instance only the lattice 41 from FIG. 7A. FIG. 8B shows the far field for the photonic crystal 4 in accordance with FIG. 7B. The underlying semiconductor component 1 is based on indium gallium nitride. The semiconductor layer sequence has a total thickness (D+T) of approximately 5 μm to 6 μm. The peak wavelength λ0 is approximately 450 nm. In accordance with FIG. 8A, the single normalized reciprocal lattice constant of the hexagonal lattice is 2.3. In accordance with FIG. 8B, the normalized reciprocal lattice constants of the two superpositioned lattices are approximately 1.15 and 2.3.

In comparison with a modified photonic crystal for instance in accordance with FIG. 6A or FIG. 8A, an intensity of the radiation emitted by the semiconductor component 1 in accordance with FIG. 6B or FIG. 8B is increased by several percent. Furthermore, the radiation is emitted in each case in a concentrated manner into a comparatively small solid angle range.

Figure 9:
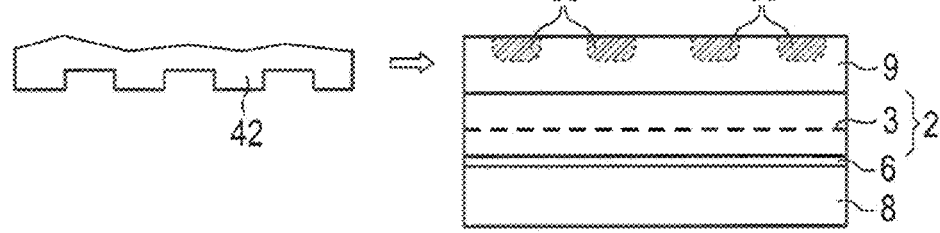
FIG. 9 shows a schematic illustration of a method for producing a semiconductor component.
Figure 9:
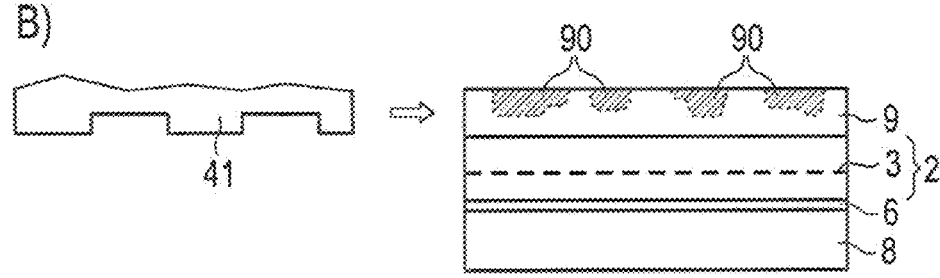
Figure 9:
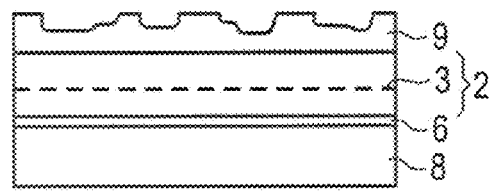
Figure 9:
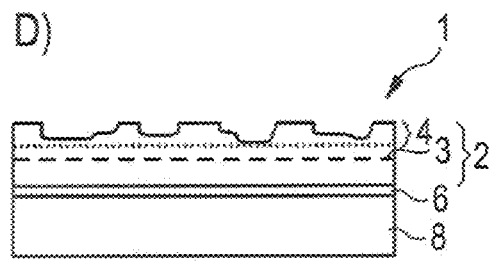

FIG. 9 illustrates a production method for the optoelectronic semiconductor component 1. By way of example, a semiconductor component 1 in accordance with FIG. 7B can be produced by the method.

In accordance with FIG. 9A, with a lithographic method, the lattice 42 is transferred by exposure to a photoresist 9 applied on the semiconductor layer sequence 2 having the active layer 3. Alternatively, the lattice 42 can be written to the photoresist 9, for example, by electron radiation. This results in exposed or electron-irradiated regions 90 of the photoresist 9.

In accordance with FIG. 9B, the further lattice 41 is likewise transferred to the photoresist 9 such that a more complex pattern of the exposed or irradiated regions 90 arises. The dose of the exposure or of the irradiation is preferably chosen such that the photoresist 9 is not saturated by the exposure or by the irradiation. The photoresist is a positive resist, for example.

FIG. 9C illustrates the geometry of the photoresist 9 after the exposed or irradiated regions 90 have been removed. Etching is subsequently effected as a result of which the structure of the photoresist 9 is transferred to the semiconductor layer sequence 2, thus resulting in the photonic crystal 4 as shown in FIG. 9D.

Instead of a lithographic or photolithographic method, a photonic crystal 4 formed by superposition of two lattices can also be produced, for example, by a so-called "nanoimprint" method. In this case, a correspondingly shaped stamp is pressed onto the photoresist 9, whereupon etching is effected such that the structure of the stamp can be transferred to the semiconductor layer sequence 2 with the aid of the photoresist.

Figure 10:
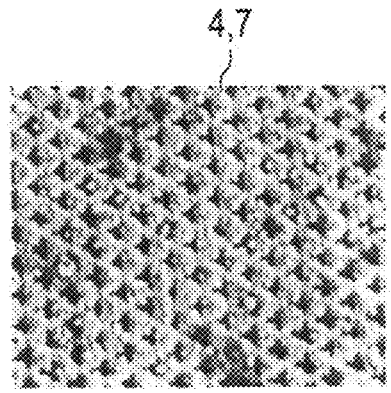

FIG. 10 illustrates a plan view of the photonic crystal 4 in accordance with FIG. 7B. In this case, the photonic crystal 4 is covered with a transparent, electrically conductive layer 7, thus resulting, for example, in the semiconductor component 1 in accordance with FIG. 2.

Figure 11:
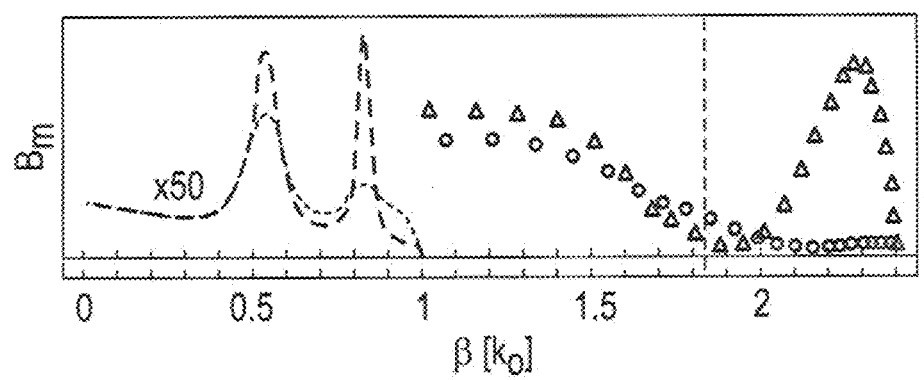
FIG. 11 shows a schematic illustration of an example of a mode distribution of a semiconductor component.

FIG. 11 illustrates a mode intensity $B_m$ of a mode distribution $\beta_m$ in units of $k_0=2\pi/\lambda 0$. Below $\beta_m=1$, the mode intensity $\beta_m$ is illustrated in a manner enlarged by a factor of 50. The mode distribution $\beta_m$ has a wide maximum around approximately 1.3 and a narrower maximum around approximately 2.3. With a photonic crystal 4 having reciprocal lattice constants of 1.15 and 2.3, for example, as shown in FIG. 7B, a high coupling-out efficiency can be obtained in the case of a mode distribution $\beta_m$ of this type.

Depending on the mode distribution $\beta_m$, the reciprocal lattice constants, particularly in the case of a photonic crystal 4 formed by superposition of two lattices, are adaptable. If the mode distribution has a plurality of maxima, then the photonic crystal 4 can preferably also be formed by a superimposition of more than two lattices, for example, by superimposition of three or of four lattices having different lattice constants.

Our components and photonic crystals disclosed herein are not restricted by the description on the basis of the examples. Rather, this disclosure encompasses any novel feature and also any combination of features, which in particular includes any combination of features in the appended claims, even if the feature or combination itself is not explicitly specified in the claims or examples.

The invention claimed is:

1. An optoelectronic semiconductor component comprising: a semiconductor layer sequence having at least one active layer, and a photonic crystal that couples radiation having a peak wavelength out of or into the semiconductor layer sequence, wherein the photonic crystal is at a distance from the active layer and formed by superimposition of at least two lattices having mutually different reciprocal lattice constants normalized to the peak wavelength, wherein the two lattices are hexagonal lattices, wherein the following is satisfied for the two normalized reciprocal lattice constants G1 and G2:

$G1=(2\lambda_0)/(3^{0.5} A1)$ and $G2=(2\lambda_0)/(3^{0.5} A2)$ where $\lambda_0$ is the peak wavelength in a vacuum and A1, A2 are distinct real lattice constants, and wherein the following is satisfied for an absolute value of a difference between the two normalized reciprocal lattice constants: $0.5 \leq |G_1 - G_2| \leq 2.5$.

2. The optoelectronic semiconductor component according to claim 1, wherein
one of the normalized reciprocal lattice constants is 1.0 to 1.35, and another of the lattice constants is 1.7 to 2.6,
the at least two lattices are formed by holes having mutually different average radii,
average radius of the holes of the lattice having the smaller real lattice constant A2 is 0.15×A2 to 0.30×A2,
average radius of the holes of the lattice having the larger real lattice constant is 0.40×A2 to 0.50×A2, and the holes of the at least two lattices have the same depths.

3. The optoelectronic semiconductor component according to claim 1, wherein the photonic crystal is a part of the semiconductor layer sequence.

4. The optoelectronic semiconductor component according to claim 1, wherein the following is satisfied for one or for two of normalized reciprocal lattice constants G:

0.7<G<n, where n is a maximum refractive index of the semiconductor layer sequence.

5. The optoelectronic semiconductor component according to claim 1, wherein the photonic crystal is formed by superposition of the at least two lattices.

6. The optoelectronic semiconductor component according to claim 1, wherein the photonic crystal is based on at least one of the following materials or consists thereof:
$Al_nGa_mIn_{1-n-m}N$, $Al_nGa_mIn_{1-n-m}P$, ZnO, ZnMgO, CdS, ZnCdS, MgBeO, ZnSe, ZnS and ITO.

7. The optoelectronic semiconductor component according to claim 1, wherein a mirror is fitted at a main side of the semiconductor layer sequence that faces away from the photonic crystal, and a distance between the mirror and the active layer is at least 100 nm and at most 6 µm.

8. The optoelectronic semiconductor component according to claim 1, wherein a distance between the photonic crystal and the active layer is at least 150 nm and at most 8 µm.

9. The optoelectronic semiconductor component according to claim 1, wherein Fourier amplitudes of a two-dimensional Fourier transformation of the photonic crystal the Fourier amplitudes originate from respectively a strongest band from one of the lattices in the Fourier transformation, are of equal magnitude with a tolerance of at most 25%.

10. The optoelectronic semiconductor component according to claim 1, wherein the at least one active layer generates ultraviolet, visible and/or near-infrared light, and at least 40% of an intensity of light leaving the semiconductor layer sequence and/or the photonic crystal is emitted from the photonic crystal within an angle range with an aperture angle of at most 50°.

11. The optoelectronic semiconductor component according to claim 1, wherein a side of the photonic crystal that faces away from the active layer is covered with a radiation-transmissive, electrically conductive layer.

12. The optoelectronic semiconductor component according to claim 1, wherein the photonic crystal, as seen in at least one cross section, has a rectangular-sawtooth-shaped surface.

13. An optoelectronic semiconductor component comprising:
a semiconductor layer sequence having at least one active layer,
a photonic crystal coupling radiation having a peak wavelength out of or into the semiconductor layer sequence, and
a mirror fitted at a main side of the semiconductor layer sequence that faces away from the photonic crystal at a distance between the mirror and the active layer of at least 100 nm and at most 6 µm,
wherein:
the photonic crystal is at a distance from the active layer and is formed by superimposition of at least two lattices having mutually different reciprocal lattice constants normalized to a peak wavelength,
one of the normalized reciprocal lattice constants is 1.0 to 1.35, and another of the lattice constants is 1.7 to 2.6;
the at least two lattices are formed by holes, having mutually different average radii, average radius of the holes of the lattice having the smaller real lattice constant A2 is 0.15×A2 to 0.30×A2,
average radius of the holes of the lattice having the larger real lattice constant is 0.40×A2 to 0.50×A2,
the two lattices are hexagonal lattices and the two lattice constants differ by a factor of $3^{0.5}$,
the holes of the at least two lattices have the same depths, and
a distance between the photonic crystal and the active layer is at least 150 nm and at most 8 μm.

* * * * *